United States Patent [19]

Robb

[11] Patent Number: 4,857,868

[45] Date of Patent: Aug. 15, 1989

[54] DATA DRIVEN CLOCK GENERATOR

[75] Inventor: James R. Robb, Marion, Iowa

[73] Assignee: Rockwell International Corporation, El Segundo, Calif.

[21] Appl. No.: 176,078

[22] Filed: Mar. 30, 1988

[51] Int. Cl.[4] .............................................. H03B 1/00
[52] U.S. Cl. .................................. 331/135; 307/269; 307/480; 328/63
[58] Field of Search ................ 331/135, 136; 307/269, 307/480; 328/63, 72

[56] References Cited

U.S. PATENT DOCUMENTS

| | | | |
|---|---|---|---|
| 3,973,222 | 8/1976 | Kucharewski | 331/111 |
| 4,241,418 | 12/1980 | Stanley | 307/480 X |
| 4,604,582 | 8/1986 | Strenkowski | 328/55 |
| 4,646,030 | 2/1987 | Hollister | 331/1 A |
| 4,691,121 | 9/1987 | Theus | 307/269 |

*Primary Examiner*—Eugene R. Laroche
*Assistant Examiner*—Robert J. Pascal
*Attorney, Agent, or Firm*—John C. McFarren; M. Lee Murrah; H. Fredrick. Hamann

[57] ABSTRACT

A data driven clock generator provides a clock having a minimum cycle for a computer processor that implements asynchronous operations. The clock generator includes a basic oscillator that provides a feedback signal as a first input to a logic gate. A data valid signal, which may be generated by a multiplexer having a plurality of test inputs, is provided as a second input to the logic gate. The logic gate produces a trigger signal for starting the oscillator. If an asynchronous operation is not complete by the end of the minimum clock cycle, the oscillator is halted to stretch the clock until a data valid signal is received. The feedback signal provided to the logic gate guarantees completion of a minimum clock cycle upon receipt of a data valid signal even if the data valid signal is unstable during the clock cycle. The data driven clock generator stretches the clock on a cycle-by-cycle basis as necessary, and the oscillator completes a minimum cycle when triggered by a data valid signal even if the signal becomes unstable during the minimum cycle.

3 Claims, 1 Drawing Sheet

4,857,868

DATA DRIVEN CLOCK GENERATOR

TECHNICAL FIELD

The present invention relates to asynchronous data transfer systems and, in particular, to a processor clock that can be stretched on a cycle-by-cycle basis until an asynchronous data valid signal is received.

BACKGROUND OF THE INVENTION

Many computer processors utilize a fixed system clock that can be subdivided to form a processor clock. The processor clock is generally derived by means that allow it to be stretched in whole system clock cycle time increments. When the processor accesses an asynchronous operation, the processor clock is stretched until an asynchronous data valid signal is received. Because the system clock frequency is fixed, the processor clock must continue to be stretched after receipt of the data valid signal until it is synchronized to the system clock through two stages of synchronizing flip-flops. After synchronization, the processor clock resumes its normal frequency. However, the period of time required for synchronization of the processor clock constitutes wasted time.

A major design factor for a data driven clock is that the clock generator should not waste time synchronizing to an external input. In a computer processor, there is always a minimum cycle period that must be met. During data transfer if a data valid signal is not received by the end of the minimum cycle period, then the cycle must be stretched until the data valid signal is received. To prevent wasted time from unnecessary processor clock stretching, each clock cycle should be tested and stretched on an individual basis.

Basic free-running oscillator circuits are well-known means for stretching processor clock cycles on an individual basis. Such an oscillator circuit is illustrated and described in conjunction with FIG. 1 of U.S. Pat. No. 4,691,121 to Theus, which is hereby incorporated by reference. However, such basic oscillator circuits are sensitive to changes, instabilities, and noise in the data valid signal. This sensitivity results in instabilities and delays in reestablishing the processor clock cycle after it has been stretched. Therefore, there is a need for a simple oscillator circuit that functions as a data driven clock generator which can stretch the processor clock on a cycle-by-cycle basis and which is insensitive to instabilities in the data valid signal. Such a clock generator should allow a data valid signal to stabilize without wasting time in reestablishing the normal processor clock cycle.

SUMMARY OF THE INVENTION

The data driven clock generator of the present invention is an improvement of a basic oscillator circuit. The basic oscillator includes a trigger signal line as a first input to a NAND gate having a Q output that is inverted to form a clock signal. The Q output is also passed through a delay circuit which produces a delay signal that is fed back as a second input to the NAND gate. This basic logic circuit functions as a free-running oscillator when the trigger signal is high. When the trigger signal is pulled low during the second half of a cycle, the free-running oscillator is halted. The clock cycle then stretches until the trigger signal returns high. However, during the first half of the clock cycle the trigger signal must be stable in the basic oscillator because the Q output follows the trigger signal when the delay signal is high.

The present invention improves the basic oscillator by adding a second NAND gate having a test input strobe signal as one input and the Q signal fed back from the first NAND gate as a second input. The second NAND gate produces the trigger signal that is input to the first NAND gate. When the strobe signal is high, the trigger signal goes low to halt the oscillator and stretch the clock. when the strobe signal switches low, the trigger signal goes high to restart the clock cycle.

In the circuit of the present invention, the clock will complete its minimum cycle once triggered even if the strobe signal becomes unstable. Of course, the strobe signal must be stable at the end of the minimum cycle for the clock to continue. However, the feedback of the Q output to the second NAND gate allows the clock to complete a minimum cycle when triggered even if the strobe signal is unstable during that clock cycle. Thus, the present invention allows time for the last test condition to be removed, the new test condition to be selected, and the data valid signal to stabilize.

BRIEF DESCRIPTION OF THE DRAWINGS

For a more complete understanding of the present invention and for further advantages thereof, reference is made to the following Description of the Preferred Embodiment taken in conjunction with the accompanying Drawings, in which.

DESCRIPTION OF THE PREFERRED EMBODIMENT

Figure 1:
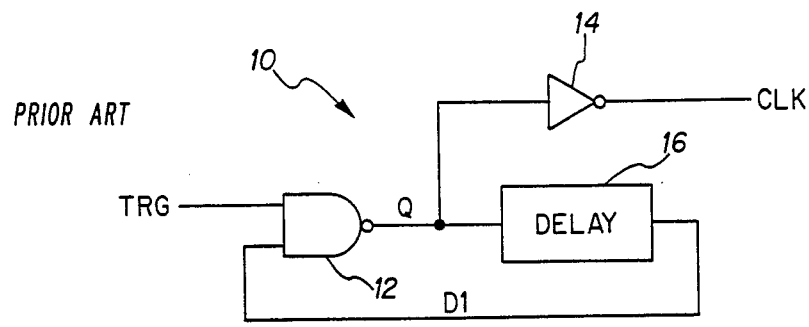
FIG. 1 is a block diagram of a basic oscillator of the prior art.

FIG. 1 illustrates a basic oscillator 10 as is well-known in the prior art. Oscillator 10 includes a NAND gate 12 that receives a trigger signal TRG as a first input. The output of NAND gate 12 is a signal Q that is inverted by inverter 14 to provide a clock signal CLK. The signal Q is also provided to a delay circuit 16 which produces delay signal D1 that is fed back as a second input to NAND gate 12. When trigger signal TRG is high, oscillator 10 functions as a free-running oscillator circuit. With TRG high and D1 high, Q does low to start a clock cycle. After passing through the delay 16, the Q low signal becomes a D1 low signal. The D1 low signal input to gate 12 causes the Q signal to return high. As long as the trigger signal TRG remains high, oscillator 10 continues to cycle in this manner at a frequency determined by the delay 16.

Oscillator 10 is halted by pulling the trigger signal TRG low during the second half of the clock cycle when delay signal D1 is low. With TRG low, Q will go high and remain high so that the clock cycle is stretched as CLK remains low. The cycle will be stretched until trigger signal TRG returns high. Thus, basic oscillator 10 has the ability to stretch the clock on a cycle-by-cycle basis and it requires no synchronization to an external clock. However, during the first half of the clock cycle when Q is low and D1 is high, the trigger signal TRG must remain high or the cycle will be shortened. Thus, oscillator 10 is sensitive to instabilities in the data valid indication (TRG high), which can cause disruptions of the normal clock cycle.

Figure 2:
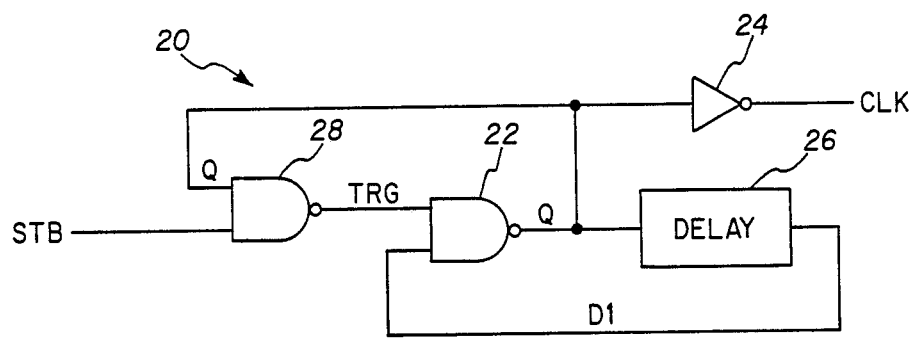
FIG. 2 is a block diagram of a data driven clock generator of the present invention.

FIG. 2 illustrates a data driven clock generator of the present invention. Clock generator 20 includes gate 22, inverter 24, and delay 26 that correspond to gate 12, inverter 14, and delay 16, respectively, of basic oscillator 10 of FIG. 1. Clock generator 20 also includes a second NAND gate 28 that produces trigger signal TRG for input to gate 22. A strobe signal STB is provided as one input to gate 28. Strobe signal STB may be an output of a multiplexer having a plurality of test input signals. The Q signal output from gate 22 is fed back as a second input to the gate 28 as illustrated in FIG. 2. Data driven clock generator 20 functions similarly to the basic oscillator 10, except that during the majority of the minimum cycle time clock generator 20 is insensitive to changes in the data valid indication of strobe signal STB going low. Thus, clock generator 20 allows time for the last test condition to be removed, the new test condition to be selected, and the data valid indication to stabilize.

Figure 3:
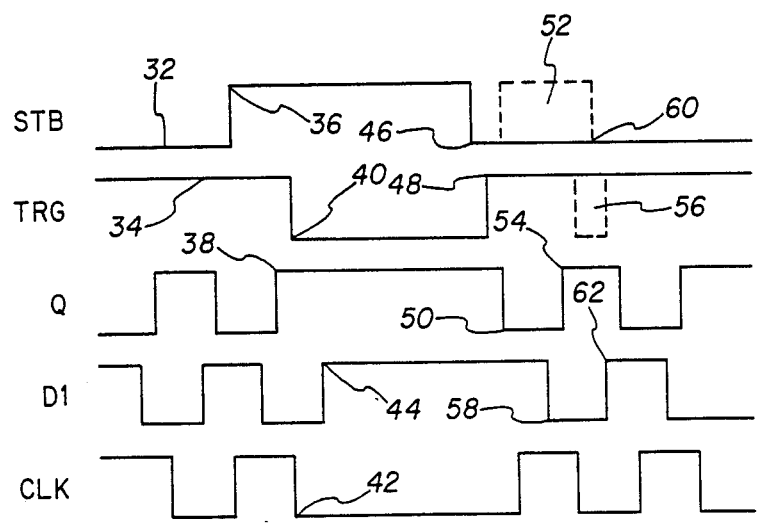
FIG. 3 is a timing diagram showing the relationship of the various input and output signals of the data driven clock generator illustrated in FIG. 2.

FIG. 3 is a timing diagram showing the relationship of the input and output signals during operation of data driven clock generator 20 of FIG. 2. As shown in FIG. 3, the output of NAND gate 28, trigger signal TRG, remains high 34 when strobe signal STB is low 32. With STB low and TRG high, clock generator 20 is a free-running oscillator with output clock signal CLK. If the strobe signal STB goes high 36 at the beginning of a clock cycle (CLK high), TRG will remain high 34 as long as Q is low. When Q goes high 38, TRG will go low 40 after a short delay associated with gate 28. With TRG low 40, Q will remain high 38, which causes D1 to remain high 44 and clock signal CLK to remain low 42. Thus, clock signal CLK is stretched until strobe signal STB returns low 46 as a data valid indication. However, if strobe signal STB returns low so that TRG returns high before D1 returns high 44, clock signal CLK will continue its normal oscillation without being stretched.

When STB goes low 46 after clock signal CLK has been stretched, TRG goes high 48 after the gate delay associated with gate 28. When TRG goes high 48, Q goes low 50 after the gate delay associated with gate 22. Thus, the data valid indication of STB low 46 causes clock signal CLK to resume its normal oscillation.

Because signal Q is fed back to NAND gate 28, clock generator 20 is insensitive to instabilities in the data alid indication (STB low) during the period 52 illustrated in phantom. After STB goes low 46, which drives TRG high 48 and Q low 50, TRG will remain high 48 as long as Q is low 50 regardless of any change in STB. When Q returns high 54, TRG goes low during period 56 illustrated in phantom. However, during period 56 Q will remain high 54 as long as D1 is low 58, but STB must be stabilized low 60 at a time sufficient to return TRG high as D1 returns high 62. If STB has stabilized low at point 60, clock generator 20 will continue to oscillate at its normal clock cycle; otherwise the clock cycle will be stretched as described above.

The strobe signal STB, which functions as a data valid indication, may be provided to clock generator 20 from a multiplexer having a plurality of test inputs as is well-known in the art. Also, one or more of the logic gates of clock generator 20 may be replaced with flip-flops and minor circuit modifications to provide an alternate embodiment of the present invention.

Although the present invention has been described with respect to a specific embodiment thereof, various changes and modifications may be suggested to one skilled in the art, and it is intended that the present invention encompass such changes and modifications as fall within the scope of the appended claims.

I claim:

1. A clock synchronization circuit, comprising:
a first logic circuit for receiving a clock signal and an asynchronous data valid signal and for generating a trigger signal having first and second states;
a second logic circuit for receiving said trigger signal and a delay signal and for generating said clock signal;
a delay circuit for receiving said clock signal and generating said delay signal;
wherein said second logic circuit and said delay circuit form a free-running oscillator with said clock signal having a predetermined clock cycle when said trigger signal is in said first state, and wherein said clock cycle is stretched when said trigger signal is in said second state;
said data valid signal controlling the state of said trigger signal; and
said clock signal input to said first logic circuit stabilizing said trigger signal during instability of said data valid signal.

2. A circuit for stretching a clock signal on a cycle-by-cycle basis until an asynchronous signal is received indicating valid data, comprising;
a first NAND gate for receiving the clock signal and the asychronous signal and for generating a trigger signal having first and second states;
a second NAND gate for receiving said trigger signal and a delay signal and for generating the clock signal;
a delay circuit for receiving the clock signal and generating said delay signal;
wherein said second NAND gate and said delay circuit form a free-running oscillator with the clock signal having a predetermined clock cycle when said trigger signal is in said first state, and wherein said clock cycle is stretched when said trigger signal is in said second state;
the asynchronous signal controlling the state of said trigger signal; and
the clock signal input to said first NAND gate stabilizing said trigger signal during instability of the valid data indication.

3. In a clock synchronization circuit comprising an oscillator having a two-state trigger signal input and a clock signal output, said clock signal having a predetermined clock cycle when said trigger signal is in a first state and said clock cycle being stretched when said trigger signal is in said second state, the improvement comprising:
a logic circuit having the clock signal and an asynchronous data valid signal as inputs for generating the trigger signal;
said asynchronous data valid signal controlling the state of the trigger signal; and
the clock signal input to said logic circuit stabilizing said trigger signal during instability of said asynchronous data valid signal.

* * * * *